(12) United States Patent
Chan et al.

(10) Patent No.: US 6,842,034 B1
(45) Date of Patent: Jan. 11, 2005

(54) SELECTABLE DYNAMIC RECONFIGURATION OF PROGRAMMABLE EMBEDDED IP

(75) Inventors: Vinson Chan, Fremont, CA (US); Chong Lee, San Ramon, CA (US); Rakesh Patel, Cupertino, CA (US); Ramanand Venkata, San Jose, CA (US); Binh Ton, San Jose, CA (US)

(73) Assignee: Altera Corporation, San Jose, CA (US)

( * ) Notice: Subject to any disclaimer, the term of this patent is extended or adjusted under 35 U.S.C. 154(b) by 15 days.

(21) Appl. No.: 10/612,253

(22) Filed: Jul. 1, 2003

(51) Int. Cl.[7] .............................................. H03K 19/00
(52) U.S. Cl. ................... 326/8; 326/37; 326/39
(58) Field of Search ................ 326/8, 38–41; 716/17

(56) References Cited

U.S. PATENT DOCUMENTS

| | | | | |
|---|---|---|---|---|
| 6,260,087 B1 | * | 7/2001 | Chang | 710/100 |
| 6,326,806 B1 | * | 12/2001 | Fallside et al. | 326/38 |
| 6,605,962 B2 | * | 8/2003 | Lee et al. | 326/41 |
| 6,744,274 B1 | * | 6/2004 | Arnold et al. | 326/16 |
| 6,779,168 B2 | * | 8/2004 | Hamlin | 716/16 |

* cited by examiner

*Primary Examiner*—Vibol Tan
(74) *Attorney, Agent, or Firm*—Fish & Neave LLP; Joel Weiss

(57) ABSTRACT

Improved communication, and an improved communication interface, between the core PLD fabric of a PLD and embedded IP building blocks resident therein is provided. A circuit according to the invention may include at least two different signal paths between the PLD core fabric and embedded IP building blocks. Either one, or both, of these two paths may be used for configuration and/or implementation of the embedded IP building blocks.

18 Claims, 3 Drawing Sheets

| Frame | Management frame fields | | | | | | | |
|---|---|---|---|---|---|---|---|---|
| | PRE | ST | OP | PRTAD | DEVAD | TA | ADDRESS/DATA | IDLE |
| Address | 1...1 | 00 | 00 | PPPPP | EEEEE | 10 | AAAAAAAAAAAAAAAA | Z |
| Write | 1...1 | 00 | 01 | PPPPP | EEEEE | 10 | DDDDDDDDDDDDDDDD | Z |
| Read | 1...1 | 00 | 11 | PPPPP | EEEEE | Z0 | DDDDDDDDDDDDDDDD | Z |
| Read inc. | 1...1 | 00 | 10 | PPPPP | EEEEE | Z0 | DDDDDDDDDDDDDDDD | Z |

FIG. 3

SELECTABLE DYNAMIC RECONFIGURATION OF PROGRAMMABLE EMBEDDED IP

BACKGROUND OF THE INVENTION

This invention relates to high-speed serial communication ("HSSC") and high-speed serial interface ("HSSI") circuitry. More particularly, this invention relates to configuring HSSI circuitry.

If the circuitry of this invention is used in a device such as a Programmable Logic Device (PLD)—e.g., to provide an interface between the PLD and other electronic devices—the PLD can be either field programmable, mask programmable, or programmable in any other way. It will be understood that terms like "PLD," "programmable," and the like include all of these various options. Also, terms like HSSI and HSSC are used just for convenience herein and not with the intention of limiting the invention to any rigorously defined set of possible applications or uses. Thus, the invention is applicable in any context that involves an appropriate type of communication or signaling.

HSSC is becoming increasingly popular for many different communication applications. HSSC can take many forms, including (1) many industry-standard forms such as XAUI, Infiniband, Gigabit Ethernet, Packet Over SONET or POS0 5, etc., and (2) any of a wide range of non-industry-standard or "custom" forms that particular users devise for their own uses. Such custom protocols often have at least some features similar to industry-standard protocols, but deviate from industry standards in other respects.

PLDs are typically designed to meet a wide range of different user needs. This is done so that a PLD can be manufactured in large quantities (and therefore at reduced unit cost) and sold to a large number of users for many different uses. There is increasing interest in using PLDs in applications involving HSSC. In keeping with the usual philosophy behind the design of PLDs (and in view of the many different HSSC protocols that are known and that can be developed), it is desirable for a PLD that may be used in HSSC applications to have considerable flexibility with regard to supporting different HSSC protocols.

Illustrative PLDs with certain HSSC capabilities are shown in Aung et al. U.S. patent application Ser. No. 09/805,843, filed Mar. 13, 2001, Lee et al. U.S. patent application Ser. No. 10/093,785, filed Mar. 6, 2002, and Venkata et al. U.S. patent application Ser. No. 10/195,229, filed Jul. 11, 2002. The PLDs shown in these references can support various HSSC protocols. But even greater flexibility in that regard would be desirable and is among the motivations for the present invention.

This particular invention relates to HSSI which is implemented as embedded IP (Intellectual Property) building blocks. IP building blocks (alternatively referred to as "firmware") may be software, hardware or some combination of the two. These building blocks provide the user with pre-programmed special purpose functionality—e.g., providing the user with different pre-programmed HSSI protocols to allow a first electronic device to communicate with a second electronic device using HSSC. This functionality is typically designed to be accessed by an electronic device which may be mounted, together with any hardware that may be associated with the embedded IP, on a silicon chip. Access to these building blocks allows the user to implement the functionality associated with the building blocks without requiring the user to program, or hardwire, the functionality himself. This saves the user time and programming resources.

More particularly, this invention relates to the dynamic configuration of protocols supporting the embedded IP building blocks in a Programmable Logic Device (PLD). In conventional PLDs, the user must pre-configure the protocols supported by the embedded IP blocks before the beginning of the operation of the PLD. The configuration of the embedded IP blocks typically occurs on start-up when all the configuration instructions, data or other information for the embedded IP blocks may be serially shifted in to the PLD from an external PLD configuration device.

Furthermore, in order to configure the embedded IP, a multitude of signals and hooks (which may be general routing resources in a PLD) must be transmitted from the core PLD fabric (which may include a PLD configuration control block and PLD core building blocks) to the embedded IP building blocks. The transmission of the signals and hooks may be limited by the capacity of the interface between the core PLD fabric and the embedded IP building blocks. In fact, the requirement for a multitude of routing resources may prevent the user from being able to dynamically reconfigure the embedded IP building blocks when the PLD is operating.

Therefore, it would be desirable to provide improved communication, and an improved communication interface, between core PLD fabric and the embedded IP building blocks.

SUMMARY OF THE INVENTION

It is an object of this invention to provide improved communication, and an improved communication interface, between core PLD fabric and the embedded IP building blocks.

Systems and methods according to the invention provide improved communication between the core PLD fabric and the embedded IP building blocks as follows. A circuit according to the invention may include at least two different signal paths between the PLD core fabric and embedded IP building blocks. Either one, or both, of these two paths may be used for configuration and/or implementation of the embedded IP building blocks.

One of the two paths may be coupled through an MDIO (Management Data Input/Output Interface) configuration control block. This interface, which may form a portion of the embedded IP fabric (together with the embedded IP building blocks), is part of the IEEE specification for Gigabit Ethernet and 10K Gigabit Ethernet. MDC is a clock specified by the IEEE specification for Gigabit Ethernet and it clocks the MDIO block.

The MDIO uses the information from the PLD core fabric to configure the embedded IP building blocks. This may be implemented using a four-bit interface between the core PLD fabric and the MDIO. By using the four-bit interface, instead of the multitude of hooks and signals, the MDIO saves the routing of many signals and congesting the interface.

The MDIO operates as follows. The MDIO can support up to 64K (65536) registers or signals. This number represents the maximum potential number of signals that may be routed from the MDIO to configure the embedded IP building blocks. Nevertheless, these signals can be accessed from the PLD by using a 4-bit interface with the MDIO. Therefore, whereas in the past hundreds of hooks must be used to configure the HSSI, in a circuit according to the invention, only a four-bit interface is required to access a large number of communication protocols stored in the MDIO.

The second of the two paths may be coupled to provide signals directly from the PLD core fabric to the embedded IP building blocks without passing through the MDIO. This path provides signals to the embedded IP building blocks in a way that the signals are provided to embedded IP building blocks in conventional PLDs.

Selection logic may also be added which is preferably user controllable to allow the user to configure the embedded IP building blocks either with signals received from the PLD core fabric or with signals received from the MDIO. It should be noted that, whereas the signal path from the MDIO may be capable of dynamically reconfiguring the embedded IP building blocks, the signal path from the PLD core fabric may only be capable of configuring the embedded IP building blocks during PLD configuration using the external PLD configuration device.

A much larger array of embedded IP building block settings may be obtained based on the improved flexibility of the dynamic reconfiguration selection logic and interface. Furthermore, specifically with respect to the interface between the PLD core fabric and the MDIO, the configurability of the embedded IP building blocks is substantially improved.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which:

FIG. 3 is a table of various Management Data Input/output Frames.

DETAILED DESCRIPTION OF THE INVENTION

Figure 1:
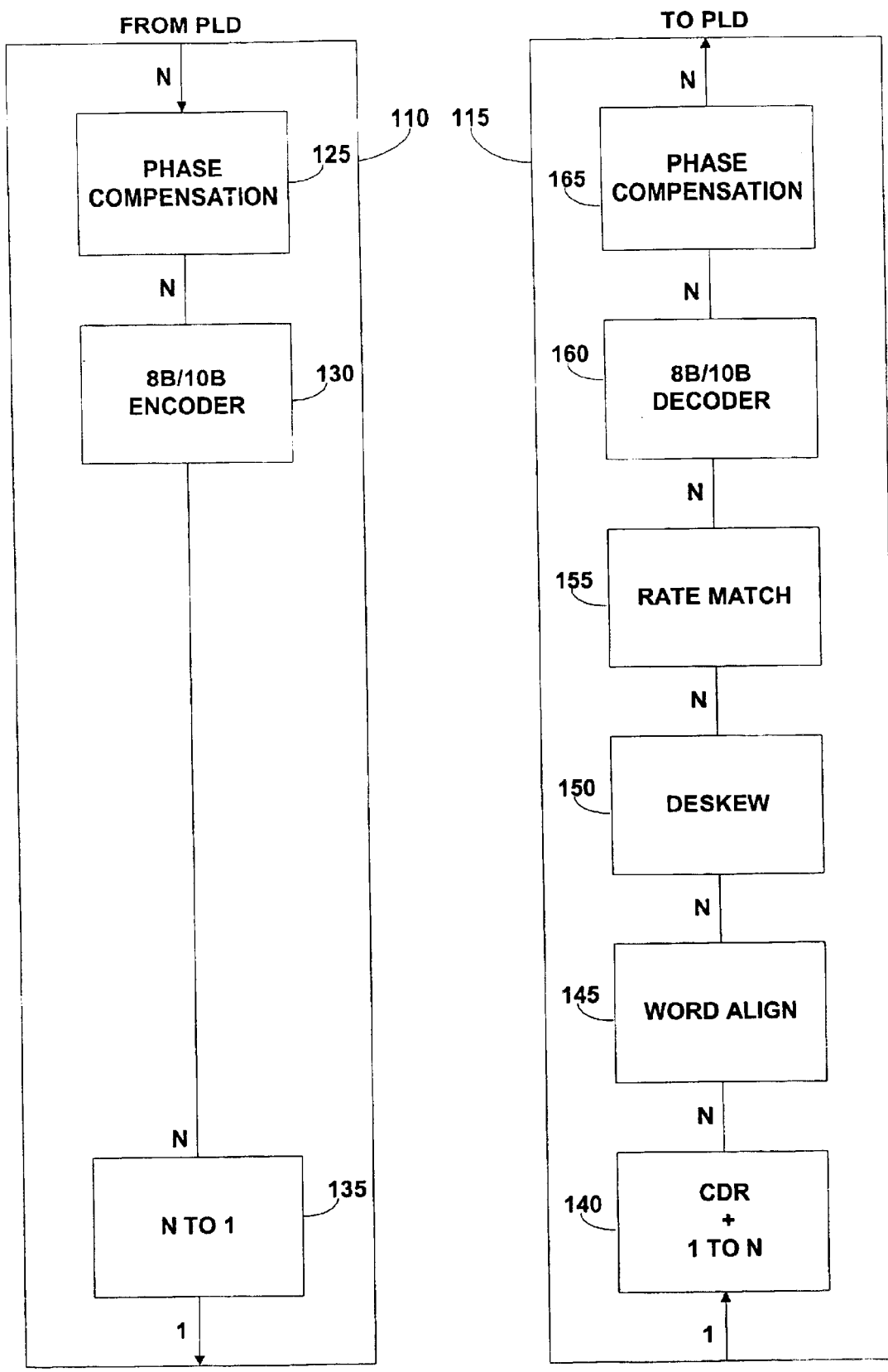
FIG. 1 is a schematic diagram of embedded IP building blocks.

FIG. 1 shows a first group 110 of embedded IPbuilding blocks for receiving high-speed signaling from the PLD as a byte of N length and transmitting the high-speed signaling from the PLD as a stream of single bits. Group 110 preferably includes phase compensation block 125 in order to adjust for a phase shift that may exist between the internal PLD signals and the signals to the external device.

Group 110 also preferably includes 8B/10B encoder 130 which may adapt the byte size from the byte size used internally by the PLD to the byte size that is used by the external device. It should be noted that 8B (8 bit) to 10B (10 bit) is only one example of an encoding and, in fact, a suitable byte size may be greater or smaller than either 8 bits or 10 bits for either the PLD or the device.

Block 135 changes the signal from a parallel signal, N, to a serial bit stream for use by the external drive.

Group 115, which is for receiving high-speed signaling from an external device and transmitting the signals to a PLD, preferably includes a Clock Data Recovery block 140 together with the block that changes the incoming signal from a serial bit stream to a parallel signal, N. Clock Data Recovery block 140 preferably derives the clock signal from the incoming signal. Word align block 145 preferably determines where the incoming word begins and ends. Deskew block 150 preferably corrects for any differences in skew between the internal PLD signals and the signals used by the external device. Rate match block 155 further coordinates the PLD clock with the clock rate of the incoming signals. Finally, 8B/10B decoder block 160 and phase compensation block 165 preferably perform the opposite function of the outgoing blocks 125 and 130 described above.

The protocol that governs the operation of the blocks should preferably be downloaded to these blocks from an external source. In one embodiment, when the protocol is generated on the PLD, the possibility of dynamically reconfiguring the protocol exists.

Figure 2:
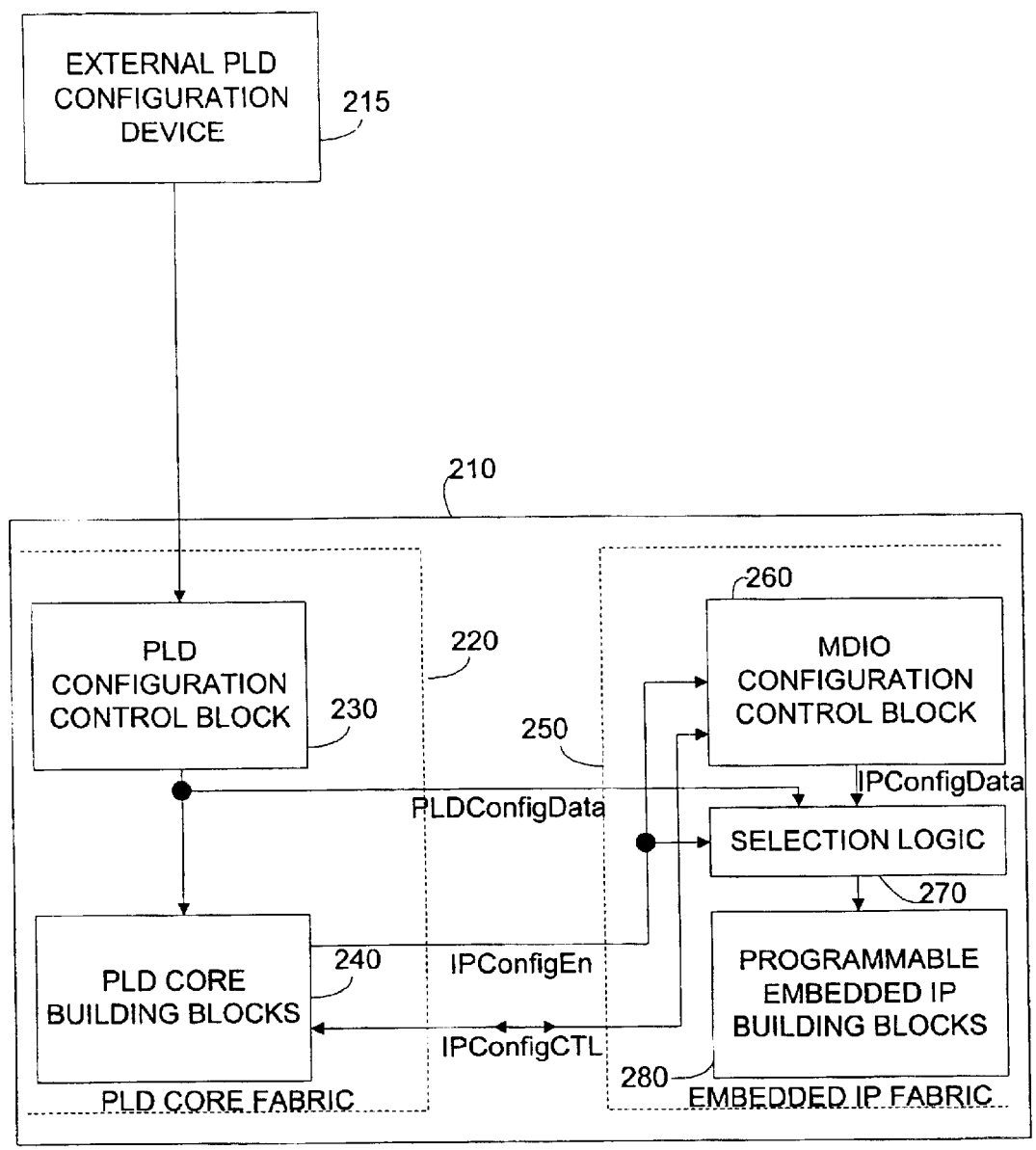
FIG. 2 is a schematic diagram of system level implementation of a PLD according to the invention.

FIG. 2 shows a PLD 210 according to the invention which preferably provides the ability to generate, and therefore dynamically reconfigure, the protocol for the embedded IP building blocks described above. PLD 210 may preferably be configured (or, is alternatively, programmed) by external PLD configuration device 215.

PLD 210 may include PLD core fabric 220 and embedded IP fabric 250. PLD core fabric 220 may be formed from PLD configuration control block 230 and PLD core building blocks 240. Embedded IP fabric 250 may be formed from MDIO configuration control block 260, selection logic 270 and programmable embedded IP building blocks 280.

In conventional PLDs including embedded IP building blocks, the configuration information for the embedded IP was serially shifted into the PLD from an external PLD configuration device to configure the embedded IP. This process occurred during the programming of the entire PLD because the PLD typically cannot operate when being configured. The embedded IP was not dynamically reconfigurable because it required input from external PLD confirmation device 215—a requirement that, in turn, led to shutting down and reprogramming, of the entire PLD.

PLD 210, on the other hand, provides MDIO 260 as one possible interface between PLD core fabric 240 and reconfigurable embedded IP building blocks 280 (via selection logic 270). MDIO 260 preferably allows embedded IP 280 to be reconfigured during operation of PLD 210 as will be explained. The other possible interface involves direct communication from PLD configuration control block 230 to selection logic 270 and then to embedded IP 280.

While MDIO 260 may typically interface with other components using a two-pin interface, nevertheless, MDIO 260 may interface with the PLD core fabric 220 using a four-pin interface.

After a series of signals are received by MDIO 260 from PLD core fabric 220, which may typically be transmitted by one or more of PLD core building blocks 240, MDIO 260 may then package these signals into a wider signal—e.g., a 16-bit signal, a 32-bit signal or other suitable size signal— and transmit the wider signal to selection logic 270 and then, from selection logic 270, to reconfigure embedded IP 280.

In one embodiment of the invention, MDIO 260 is preferably pre-programmed by the user such that when it receives signals from PLD core fabric 220—e.g., through IPConfigEn bus—it may then convert those signals into a yet larger than 16-bit set of instructions to be transmitted to embedded IP building blocks 280. The 16-bit portion of the instructions may be used for address/data information as described in detail below while the additional bits may be used for synchronization, start of frame, operation code, port address, device address, and 2-bit space to avoid contention during a read transaction. The key point is that the instructions had been serially shifted into MDIO 260, yet MDIO 260 can send out the instructions in parallel for transmission to embedded IP 280 via selection logic 270.

The 16-bit instructions may include any one of the following instructions: 1) an address instruction which indicates which address within building blocks 280 is being written to or read from, 2) a write instruction which includes the data that is being written to building blocks 280, 3) a read instruction which reads from the building block that had just been written to in order to confirm that the write occurred correctly or that reads from some other suitable location (such as status registers within building blocks 280), and 4) a read increment which increments the address by one address location after reading from the address such that the new address may be either written to or read from without receiving additional signals from MDIO 260. Thus, at least in one embodiment of the invention, MDIO 260 may receive a signal from two pins or four pins and then transmit the signal as a wide signal, preferably including a 16-bit signal, to embedded IP building blocks 280. This wide signal is what allows MDIO 260 to dynamically reconfigure the protocol supported by embedded IP building blocks 280.

As described above, one way for MDIO 260 to take a relatively small signal and convert the small signal into a relatively large signal is by storing large signals in memory and retrieving the large signals based on a code that responds to the small signals. Thus, MDIO 260 may receive a relatively small signal from PLD core fabric 220 and then use the signal as a code to access a large—e.g., greater than 16 bit—signal for transmission to building blocks 280. Alternatively, MDIO 260 may receive multiple signals across the interface from PLD core fabric 220, and serially shift the signals into a greater than 16-bit register until the greater than 16-bit signal is ready for transmission to building blocks 280. In either case, MDIO 260 may transmit a wide signal to dynamically reconfigure building blocks 280.

Selection logic 270 may be used to allow for selectability of the signals that configure building blocks 280. In one embodiment of the invention, selection logic 270 may allow PLD configuration control block 230 to configure building blocks 280 by sending signals along PLDConfigData bus when the entire PLD 210 is being configured. Then, when the PLD is operating, selection logic 270 may allow MDIO 260 to dynamically reconfigure building blocks 280 by sending signals along IPConfigData bus. The operation of selection logic 280 may be controlled by signals from PLD configuration core building blocks 240 along IPConfigEn. Thus, selection logic 280 may be used to select which signals are transmitted to building blocks 280. Other suitable selection schemes may also be implemented by selection logic 270.

Control of protocol-related features of building blocks 280 may be handed to the user following start-up, or the entire protocol support of building blocks 280 may be handed to the user. In one example of dynamic configuration, if the user wanted to change a 16-bit word alignment pattern in building blocks 280, the user would assert IPConfigEn and send the appropriate configuration data through the 4-bit IP ConfigCTL bus.

In another embodiment of the invention, and as briefly alluded to above, MDIO 260 may be used to provide status updates with respect to the operation of building blocks 280. Status information that is contained in embedded IP building blocks 280 may be retrieved by MDIO 260, and stored in MDIO status and control registers (not shown). This status information may then be transmitted to PLD core building blocks 240 along IPConfigCtl bus.

One advantage of the present invention is the ability to dynamically reconfigure embedded IP building blocks 280. Another advantage of the invention is that the invention allows the user to obtain valuable status information stored in the status and control registers in embedded IP building blocks 280. Yet a third advantage of the invention is the ability to select between configuring embedded building blocks 280 using MDIO 260 or using PLD configuration control block 230.

The table in FIG. 3 shows four possible frames (Address, Write, Read, and Read Increment) that may be implemented by the MDIO 260 in one embodiment of the invention. The address frame overwrites the address register with the new, preferably 16-bit, address in the address field. The write and read frames access the register whose address is stored in the address register. The read increment frame increments the address register by 1 after completing the read operation.

The management frame fields shown in FIG. 3 are as follows: PRE (preamble:) shows a signal of 32 ONES to establish synchronization. ST (start of frame): is typically a <00> pattern. OP (operation code): is typically <00> for address, <01>for write frame, <11> for read frame and <10> for read increment frame. PRTAD (port address) provides the port address. DEVAD (device address) provides the device address.

TA (turnaround): may be a 2-bit timing space to avoid contention during a read transaction. In address and write transactions or other suitable transactions, STA (Station Management, which sends the information to the MDIO manageable device [see below]) may drive both TA bits. In a read transaction, MMD (MDIO manageable device—the device that receives the MDIO instructions) may start to drive the $2^{nd}$ TA bit. ADDRESS/DATA are the 16 address bits of the register to be accessed on the next cycle or, alternatively, the data to be written/read to or from the register, respectively.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A programmable logic device comprising:
   a programmable logic device configuration control block;
   a plurality of programmable logic device core building blocks that are programmable based on signals received from the configuration control block;
   a management data input/output configuration control block that receives signals from the core building blocks; and
   a plurality of embedded intellectual property building blocks that are configurable based on signals received from the management data input/output configuration control block or signals received from the programmable logic device configuration control block.

2. The programmable logic device of claim 1 wherein the management data input/output configuration control block is adapted to receive status information relating to the protocol of the programmable embedded intellectual property building blocks.

3. The programmable logic device of claim 1 wherein the management data input/output configuration control block is adapted to exchange status information relating to the protocol of the embedded intellectual property building blocks with the PLD core building blocks.

4. The programmable logic device of claim 1 further comprising a selection logic block that is adapted to select between signals received from the management data input/output configuration control block and signals received from the programmable logic device configuration control block and to transmit the selected signals for configuring the programmable embedded IP building blocks.

5. The programmable logic device of claim 4 wherein the selection logic block selects based on signals received from the programmable logic device core building blocks.

6. The programmable logic device of claim 1 wherein the management data input/output configuration control block configures the programmable embedded intellectual property building blocks using a plurality of frames.

7. A digital processing system comprising:

processing circuitry;

a memory coupled to said processing circuitry; and a programmable logic device as defined in claim 1 coupled to the processing circuitry and the memory.

8. A printed circuit board on which is mounted a programmable logic device as defined in claim 7.

9. The printed circuit board defined in claim 8 further comprising:

memory circuitry mounted on the printed circuit board and coupled to the programmable logic device.

10. The printed circuit board defined in claim 9 further comprising:

processing circuitry mounted on the printed circuit board and coupled to the memory circuitry.

11. A method for changing the protocol supported by embedded intellectual property building blocks in a programmable logic device, the method comprising:

configuring the protocol of the embedded intellectual property building blocks during configuration of the programmable logic device;

commencing operation of the programmable logic device; and during operation of the programmable logic device, dynamically reconfiguring the protocol of the programmable logic device.

12. The method of claim 11 further comprising transmitting status information relating to the embedded intellectual property building blocks to a plurality of programmable logic device core building blocks.

13. The method of claim 12 wherein the transmitting further comprises transmitting via a management data input/output configuration control block.

14. The method of claim 11 further comprising transmitting status information relating to the protocol supported by the embedded intellectual property building blocks to a plurality of programmable logic device core building blocks.

15. The method of claim 11 further comprising using signals provided by a management data input/output configuration control block to reconfigure the embedded IP building blocks.

16. The method of claim 11 further comprising using signals provided by a programmable logic device configuration control block to configure the embedded IP building blocks.

17. The method of claim 11 further comprising selecting between signals provided by a management data input/output configuration control block and signals provided by a programmable logic device configuration control block, the selected signals for configuring the embedded IP building blocks.

18. The method of claim 11 wherein the signals provided by the management data input/output configuration control block are provided using a plurality of frames.

* * * * *